United States Patent
Kawabe et al.

(10) Patent No.: US 9,804,229 B2
(45) Date of Patent: Oct. 31, 2017

(54) VOLTAGE MEASURING APPARATUS

(71) Applicant: Panasonic Intellectual Property Management Co., Ltd., Osaka (JP)

(72) Inventors: Akira Kawabe, Osaka (JP); Gorou Mori, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/480,635

(22) Filed: Apr. 6, 2017

(65) Prior Publication Data

US 2017/0212173 A1    Jul. 27, 2017

Related U.S. Application Data

(60) Division of application No. 15/176,631, filed on Jun. 8, 2016, now Pat. No. 9,645,199, which is a division
(Continued)

(30) Foreign Application Priority Data

Jun. 28, 2011   (JP) .................................. 2011-142467

(51) Int. Cl.
  *H02J 7/00*   (2006.01)
  *H02J 7/04*   (2006.01)
  (Continued)

(52) U.S. Cl.
  CPC ...... *G01R 31/3658* (2013.01); *B60L 11/1859* (2013.01); *B60L 11/1861* (2013.01);
  (Continued)

(58) Field of Classification Search
  USPC ......... 324/434, 429, 430; 320/116, 119, 118, 320/120, 134, 166, 117, 121, 122, 140,
  (Continued)

(56) References Cited

U.S. PATENT DOCUMENTS 7,719,236 B2    5/2010   Hartular
7,859,223 B2 *  12/2010  Gorbold ............. G01R 31/3658
                                                  320/116
(Continued)

FOREIGN PATENT DOCUMENTS

| JP | 58-142500 A | 8/1983 |
| JP | 2009-014498 A | 1/2009 |
| JP | 2010-210391 A | 9/2010 |

OTHER PUBLICATIONS

Non-Final Office Action issued in U.S. Appl. No. 14/142,627 dated Jul. 28, 2015.
(Continued)

*Primary Examiner* — Alexis Pacheco
(74) *Attorney, Agent, or Firm* — McDermott Will & Emery LLP

(57) ABSTRACT

A voltage measuring apparatus is configured to measure voltages of respective battery cells of a battery cell array including a plurality of battery cell groups each including a predetermined number of battery cells connected in series. The voltage measuring apparatus includes a plurality of measuring units each provided for each of the battery cell groups. The adjacent measuring units are connected through a communication channel so as to perform current communication therebetween. A bidirectional diode circuit element is connected to the communication channel extending between the adjacent measuring units.

30 Claims, 5 Drawing Sheets

Related U.S. Application Data of application No. 14/142,627, filed on Dec. 27, 2013, now Pat. No. 9,389,277, which is a continuation of application No. PCT/JP2012/001562, filed on Mar. 7, 2012.

(51) Int. Cl.
*G01R 31/36* (2006.01)
*B60L 11/18* (2006.01)
*H01M 10/48* (2006.01)

(52) U.S. Cl.
CPC ........ *B60L 11/1866* (2013.01); *G01R 31/362* (2013.01); *H01M 10/482* (2013.01); *H02J 7/0021* (2013.01); *H02J 7/00* (2013.01); *H02J 7/0024* (2013.01)

(58) Field of Classification Search
USPC ....... 320/145, 103, 109, 111, 138, 141, 148, 320/150, 156, 160; 307/66, 10.1
See application file for complete search history.

(56) References Cited

U.S. PATENT DOCUMENTS

| | | | | |
|---|---|---|---|---|
| 8,183,870 | B1* | 5/2012 | Davies | H01M 10/4207 320/118 |
| 8,427,115 | B2* | 4/2013 | Nitta | B41J 2/04506 310/318 |
| 8,860,242 | B1* | 10/2014 | Pruett | H02J 4/00 307/5 |
| 2003/0044689 | A1* | 3/2003 | Miyazaki | H02J 7/0026 429/320 |
| 2005/0280964 | A1* | 12/2005 | Richmond | H02J 3/14 361/62 |
| 2007/0188149 | A1* | 8/2007 | Miyamoto | H02J 7/0016 320/134 |
| 2009/0085515 | A1 | 4/2009 | Bourilkov et al. | |
| 2010/0157495 | A1 | 6/2010 | Densham | |
| 2010/0225327 | A1 | 9/2010 | Ishikawa et al. | |
| 2011/0089898 | A1 | 4/2011 | Lee et al. | |
| 2011/0298424 | A1 | 12/2011 | Yamauchi et al. | |
| 2013/0038290 | A1 | 2/2013 | Chatroux et al. | |
| 2013/0114320 | A1 | 5/2013 | Permuy | |
| 2014/0043032 | A1 | 2/2014 | Makino et al. | |

OTHER PUBLICATIONS

International Search Report issued in International Application No. PCT/JP2012/001562 dated Jun. 12, 2012, 1 pg.
Non-Final Office Action issued in U.S. Appl. No. 14/142,627 dated Oct. 1, 2015.
Notice of Allowance issued in U.S. Appl. No. 14/142,627 dated Mar. 16, 2016.
Notice of Allowance issued in U.S. Appl. No. 15/176,631 dated Sep. 14, 2016.
Notice of Allowance issued in U.S. Appl. No. 15/176,631 dated Jan. 11, 2017.

* cited by examiner

VOLTAGE MEASURING APPARATUS

CROSS-REFERENCE TO RELATED APPLICATIONS

This Application is a Divisional Application of U.S. patent application Ser. No. 15/176,631 filed Jun. 8, 2016, which is a Divisional Application of U.S. patent application Ser. No. 14/142,627 filed Dec. 27, 2013, now U.S. Pat. No. 9,389,277, which is a Continuation Application of International Application No. PCT/JP2012/001562, filed on Mar. 7, 2012, which in turn claims priority to Japanese Patent Application No. 2011-142467 filed Jun. 28, 2011. The subject matter of each is incorporated herein by reference in entirety.

BACKGROUND OF THE INVENTION

1. Field of the Invention

The present invention relates to a voltage measuring apparatus configured to measure voltages of respective battery cells of a battery cell array including a plurality of battery cell groups, each including a predetermined number of battery cells connected in series.

2. Description of the Related Art

As batteries installed in hybrid electric vehicles (HEV) and electric vehicles (EV), highly-efficient lithium ion batteries that are higher in output voltage and energy density than secondary batteries are used in many cases. However, it is difficult to control charging and discharging of the lithium ion batteries, and the lithium ion batteries are at risk for explosion or fire. Therefore, in the case of using the lithium ion batteries as in-vehicle batteries, the voltage management of the batteries is especially important.

FIG. 5 is a circuit diagram showing a schematic configuration of a conventional battery system. As shown in FIG. 5, a conventional battery system includes an in-vehicle lithium ion battery and a voltage measuring apparatus configured to measure the voltage of the lithium ion battery. The in-vehicle lithium ion battery is constituted as a battery cell array 101 including a plurality of battery cell groups Gj connected in series, each of the plurality of battery cell groups Gj including a predetermined number of battery cells Cji (Here, j equals 1 to m, and i equals 1 to n. In an example of FIG. 5, m equals 4) connected in series. With this, since all the battery cells Cji are connected in series, the battery cell array 101 can obtain a high voltage for vehicle drive. To measure the voltages of respective battery cells Cji of the battery cell array 101, a voltage measuring apparatus 103 includes a plurality of measuring units Mj each provided for each of the plurality of battery cell groups Gj. A lower voltage and upper voltage of the battery cells Cji connected to each measuring unit Mj are input to the measuring unit Mj. To be specific, the measuring unit Mj detects the voltages (measured voltages) of the battery cells Cji connected thereto by subtracting the lower voltage of the battery cell Cji from the upper voltage of the connected battery cell Cji. A highest voltage input to the measuring unit Mj (highest voltage of the battery cell group Gj) is set to a power supply voltage VDDj, and a lowest voltage input to the measuring unit Mj (lowest voltage of the battery cell group Gj) is set to a reference voltage VSSj. To each of the measuring units Mj, a drive voltage VIOj for driving the measuring unit Mj is input.

A controller (such as a microcontroller) for measurement control of the plurality of measuring units Mj and measured value management may be provided for each of the measuring units Mj, but this causes an increase in cost. On the other hand, known is a configuration in which a single controller 102 controls all the measuring units Mj in such a manner that the plurality of measuring units Mj are connected to one another so as to be able to transmit signals to one another and receive the signals from one another. The adjacent measuring units Mj are connected to each other by a so-called daisy chain connection, that is, the adjacent measuring units Mj are connected to each other so as to be able to communicate with each other through a communication channel constituted by a communication line pair. The communication line pair includes: an upward communication path SUkj through which current communication from a lower-stage (low voltage-side) measuring unit Mj to an upper-stage (high voltage-side) measuring unit Mk (k=j+1) is performed; a downward communication path SLjk through which current communication from the upper-stage measuring unit Mk to the lower-stage measuring unit Mj is performed; an input communication line SI through which signals are input from one (lowest-stage measuring unit Mm) of the plurality of measuring units Mj to the controller 102; and an output communication line SO through which signals are input from the controller 102 to the measuring unit Mm.

With this configuration, each of the measuring units Mj measures the voltages of the corresponding battery cells Cji and transmits the measurement result to the controller 102 through the downward communication path SLjk. The controller 102 transmits a drive command through the upward communication path SUkj to the measuring unit Mj corresponding to the battery cell Cji to be measured.

Known is a configuration in which in the conventional voltage measuring apparatus as described above, to suitably maintain the insulation property of a loop circuit including the battery cell array 101 when a certain member has contacted the battery cell array 101, an element (diode) configured to prevent a current from flowing from the low potential-side measuring unit Mj to the high potential-side measuring unit Mk is connected between the adjacent measuring units Mj and Mk (see Japanese Laid-Open Patent Application Publication No. 2009-14498, for example).

SUMMARY OF THE INVENTION

A potential difference between the power supply voltage VDDj input to the certain measuring unit Mj and a reference voltage VSSk input to the measuring unit Mk (k=j+1) located at an upper stage of the certain measuring unit Mj is ideally zero. However, there is a possibility that an unexpected current flows through the battery cell group Gj by disturbances or current ripples, and this generates a potential difference between the power supply voltage VDDj and the reference voltage VSSk. Especially in the battery installed in the HEV, the EV, or the like, since the disturbances and oscillation ripples easily increase by oscillations, external environments, or the like, the potential difference is easily generated therebetween.

If the potential difference is generated between the power supply voltage VDDj and the reference voltage VSSk as above, a current flows between the power supply voltage VDDj and the reference voltage VSSk through the upward communication path SUkj or the downward communication path SLjk by this potential difference regardless of the existence or non-existence of a current communication signal. To be specific, there is a possibility that a current communication state is realized although the current communication signal is not transmitted. If such a current flows, the measuring unit Mj malfunctions, and the current communication cannot be performed appropriately (robustness and reliability cannot be increased). The above problem caused by the potential difference generated between the power supply voltage VDDj and the reference voltage VSSk cannot be solved by the configuration of Japanese Laid-Open Patent Application Publication No. 2009-14498.

The present invention was made to solve the above conventional problem, and an object of the present invention is to provide a voltage measuring apparatus capable of properly perform the current communication even if the potential difference is generated between the power supply voltage and the reference voltage in the adjacent battery cells.

A voltage measuring apparatus according to the present invention is a voltage measuring apparatus configured to measure voltages of respective battery cells of a battery cell array including a plurality of battery cell groups each including a predetermined number of battery cells connected in series, the voltage measuring apparatus including a plurality of measuring units, each provided for each of the battery cell groups, wherein: the adjacent measuring units are connected through a communication channel so as to perform current communication therebetween; and a bidirectional diode circuit element is connected to the communication channel extending between the adjacent measuring units.

According to the above configuration, the bidirectional diode circuit element is connected to the communication channel extending between the adjacent measuring units. Therefore, even in a case where the potential difference is generated between the power supply voltage that is the highest voltage input to a certain measuring unit and the reference voltage that is the lowest voltage input to a measuring unit located at an upper stage (at a high potential side) of the certain measuring unit by disturbances, current ripples, or the like, a current does not flow through the communication channel. In contrast, since a voltage higher than the forward voltage of the bidirectional diode circuit element is applied at the time of the current communication, a current flows through the communication channel to realize communication. Therefore, even if the potential difference is generated between the power supply voltage and the reference voltage in the adjacent battery cell groups, the current communication can be performed properly.

The voltage measuring apparatus may be configured such that: a current source configured to generate a current signal is configured to be connectable to the communication channel; and the bidirectional diode circuit element includes a diode whose forward direction corresponds to a direction of a current flowing through the communication channel based on the current source and whose forward voltage is 1 V or higher. With this, the current communication is performed in such a manner that the current generated by the current source flows through the communication channel at the time of the current communication. In the bidirectional diode circuit element, the forward voltage of the diode whose forward direction corresponds to the direction of the current generated by the current source is 1 V or higher. Therefore, even if the potential difference is generated by the disturbances, the current ripples, or the like, a current can be effectively prevented from flowing through the communication channel.

The voltage measuring apparatus may be configured such that: each of the measuring units is configured as a single integrated circuit chip; and the bidirectional diode circuit element is configured in the integrated circuit chip of one of the adjacent measuring units. With this, the number of parts of the voltage measuring apparatus can be effectively prevented from increasing. Even in a case where the diode which prevents the malfunctions caused by the potential difference and whose forward direction corresponds to the current communication direction is provided in the integrated circuit chip, a path through which a current flows in a direction opposite to the current communication direction is formed by the diode which is included in the bidirectional diode circuit element and whose forward direction is opposite to the current communication direction. With this, since the flow of the current in a direction opposite to the current communication direction by static electricity or the like is allowed, the break of the integrated circuit chip by an electrostatic discharge failure can be prevented.

The voltage measuring apparatus may be configured such that: the communication channel includes an upward communication path through which a current signal is transmitted from a lower-stage measuring unit that is one of the adjacent measuring units and configured to measure a voltage of the battery cell group of a low voltage side to an upper-stage measuring unit that is the other of the adjacent measuring units and configured to measure a voltage of the battery cell group of a high voltage side, and a downward communication path through which the current signal is transmitted from the upper-stage measuring unit to the lower-stage measuring unit; and the bidirectional diode circuit element is connected to at least one of the upward communication path and the downward communication path.

The above object, other objects, features, and advantages of the present invention will be made clear by the following detailed explanation of preferred embodiments with reference to the attached drawings.

The present invention is configured as explained above and has an effect of being able to properly perform the current communication even if the potential difference is generated between the power supply voltage and the reference voltage in the adjacent battery cells.

DESCRIPTION OF THE PREFERRED EMBODIMENTS

Hereinafer, embodiments of the present invention will be explained in reference to the drawings. In the following explanations and drawings, the same reference signs are used for the same or corresponding components, and a repetition of the same explanation is avoided.

Embodiment 1

Figure 1:
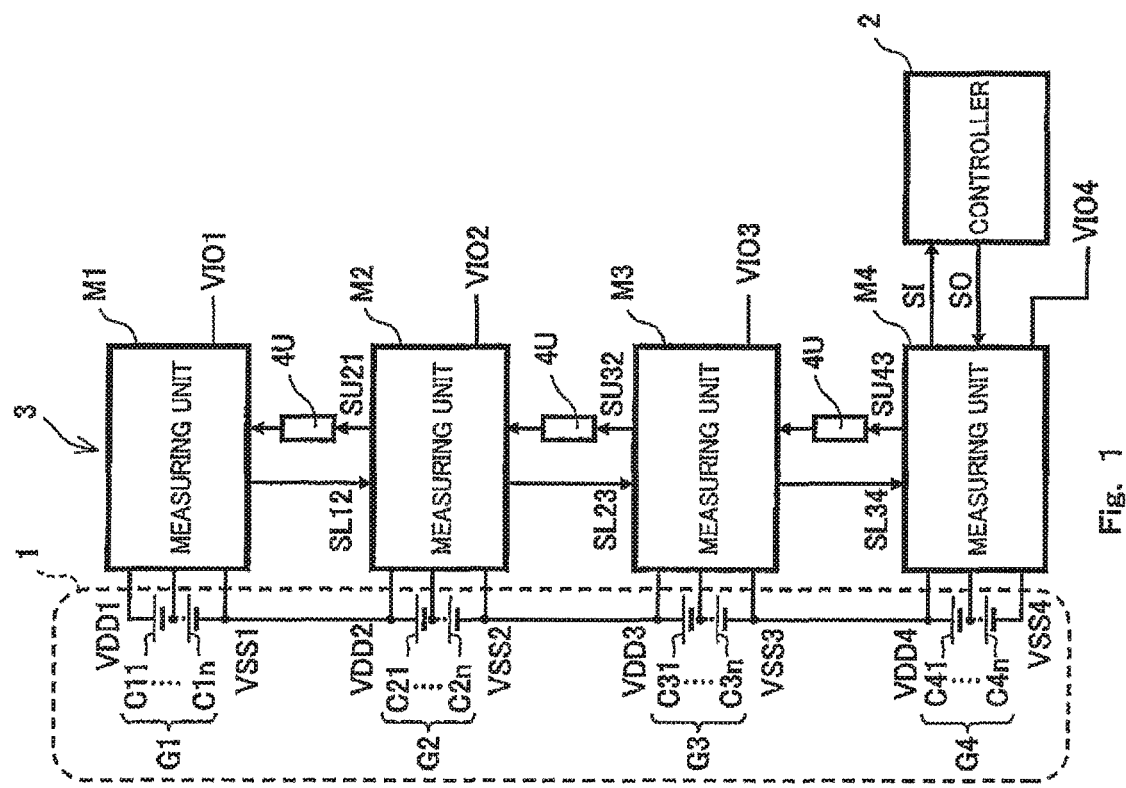
FIG. 1 is a circuit diagram showing a schematic configuration example of a battery system to which a voltage measuring apparatus according to Embodiment 1 of the present invention is applied.

First, a voltage measuring apparatus according to Embodiment 1 of the present invention will be explained. FIG. 1 is a circuit diagram showing a schematic configuration example of a battery system to which the voltage measuring apparatus according to Embodiment 1 of the present invention is applied.

As shown in FIG. 1, the battery system of the present embodiment includes a battery cell array 1 and a voltage measuring apparatus 3 configured to measure the voltage of the battery cell array 1. The battery cell array 1 is configured such that a predetermined number of battery cells Cji (Here, j equals 1 to m, and i equals 1 to n. In the present embodiment, m equals 4) are connected in series. A plurality of battery cells Cji constituting the battery cell array 1 are grouped into a plurality of battery cell groups Gj each including a predetermined number of battery cells Cji. Since all the battery cells Cji are connected in series, the battery cell array 1 can obtain a high voltage for vehicle drive. The battery cell Cji is constituted by, for example, a lithium ion battery.

To measure the voltages of respective battery cells Cji of the battery cell array 1, the voltage measuring apparatus 3 includes a plurality of measuring units Mj, each provided for each of the plurality of battery cell groups Gj. A lower voltage and upper voltage of the battery cells Cji connected to each measuring unit Mj are input to the measuring unit Mj. To be specific, the measuring unit Mj detects the voltages (measured voltages) of the battery cells Cji connected thereto by subtracting the lower voltage of the connected battery cell Cji from the upper voltage of the connected battery cell Cji. A highest voltage input to the measuring unit Mj (highest voltage of the battery cell group Gj) is set to the power supply voltage VDDj, and a lowest voltage input to the measuring unit Mj (lowest voltage of the battery cell group Gj) is set to the reference voltage VSSj. To each of the measuring units Mj, a drive voltage VIOj for driving the measuring unit Mj is input.

The voltage measuring apparatus 3 includes a controller 2 configured to perform measurement control of the plurality of measuring units Mj and measured value management. The controller 2 is constituted by, for example, a microcontroller, an internal computer, an external computer, or the like. The controller 2 is connected to any one of a plurality of measuring units Mj (in the present embodiment, a measuring unit M4 at a lowest stage (lowest potential side)). Further, the adjacent measuring units Mj are connected to each other through a communication channel so as to be able to perform current communication therebetween. With this, the plurality of measuring units Mj are connected to one another by a so-called daisy chain connection. Therefore, a drive command can be transmitted from the single controller 2 to the respective measuring units Mj, and the measured voltages can be transmitted from the respective measuring units Mj to the controller 2.

The communication channel includes: an upward communication path SUkj through which a current signal is transmitted from a lower-stage measuring unit Mj that is one of adjacent measuring units and configured to measure a voltage of the battery cell group Gj of the low voltage-side to an upper-stage measuring unit Mk that is one of adjacent measuring units and configured to measure a voltage of battery cell group Gk (k=j+1) of the high voltage-side; and a downward communication path SLjk through which the current communication from the upper-stage measuring unit Mk to the lower-stage measuring unit Mj is performed. The communication channel between one (the lowest-stage measuring unit M4) of the plurality of measuring units Mj and the controller 2 includes an input communication line SI through which signals are input from the lowest-stage measuring unit M4 to the controller 2 and an output communication line SO through which signals are input from the controller 2 to the measuring unit M4.

With this configuration, each of the measuring units Mj measures the voltages of the corresponding battery cells Cji and transmits the measurement result to the controller 2 through the downward communication path SLjk. The controller 2 transmits the drive command through the upward communication path SUkj to the measuring unit Mj corresponding to the battery cell Cji to be measured.

In the present embodiment, a bidirectional diode circuit element 4U is connected to the communication channel (in the present embodiment, the upward communication path SUkj) extending between the adjacent measuring units Mj and Mk.

According to the above configuration, the bidirectional diode circuit element 4U is connected to an upward communication path SU21 extending between the adjacent measuring units (for example, between measuring units M1 and M2). Therefore, even in a case where the potential difference is generated between a power supply voltage VDD2 that is the highest voltage input to the measuring unit M2 and a reference voltage VSS1 that is the lowest voltage input to the measuring unit M1 located at an upper stage (at the high potential side) of the measuring unit M2 by disturbances or current ripples, the potential difference generated by the disturbances, the current ripples, or the like does not exceed a forward voltage of a diode (described below) which is included in the bidirectional diode circuit element 4U and whose forward direction is a direction of the current communication in the communication channel, so that a current does not flow through the upward communication path SU21. In contrast, since a voltage higher than the forward voltage of the bidirectional diode circuit element 4U is applied at the time of the current communication, a current flows through the upward communication path SU21 to realize communication. Therefore, even if the potential difference is generated between the power supply voltage VDD2 and the reference voltage VSS1 in the adjacent battery cell groups G1 and G2, the current communication can be performed properly.

Figure 2:
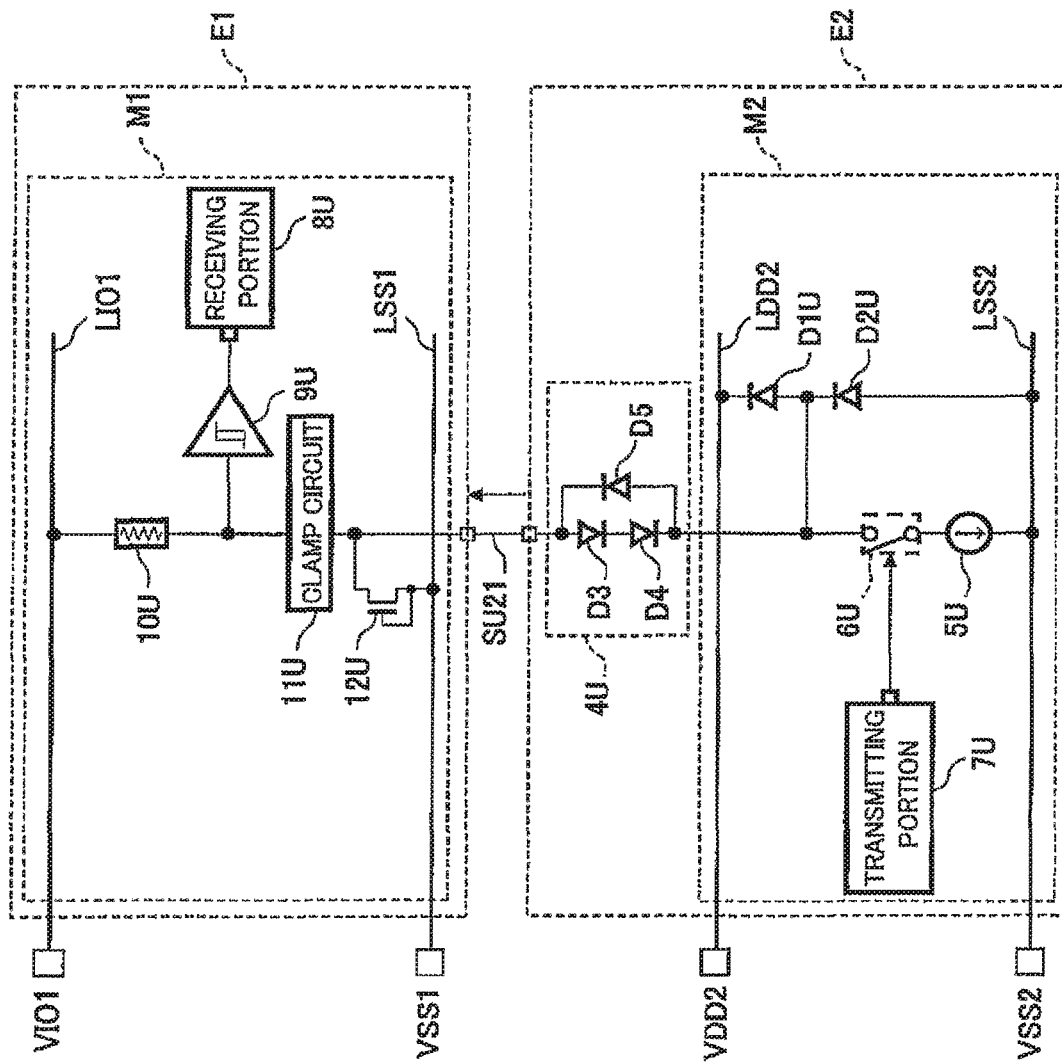
FIG. 2 is a circuit diagram showing a configuration example of communication between adjacent two of measuring units of the voltage measuring apparatus shown in FIG. 1.

Explanations will be made more specifically. FIG. 2 is a circuit diagram showing a configuration example of communication between adjacent two of the measuring units of the voltage measuring apparatus shown in FIG. 1. FIG. 2 shows a channel of the current communication through the upward communication path SU21 extending between the measuring unit M1 and the measuring unit M2. As shown in FIG. 2, the upward communication path SU21 that is the communication channel is provided so as to connect a drive voltage line LIO1 of the upper-stage measuring unit M1 to which a drive voltage VIO1 is applied and a reference voltage line LSS2 of the lower-stage measuring unit M2 to which a reference voltage VSS2 is applied.

A current source 5U configured to generate a current signal is configured to be connectable to the upward communication path SU21. Specifically, the current source 5U is provided at the lower-stage measuring unit M2, and the lower-stage measuring unit M2 includes a switch 6U configured to establish or cut the connection between the upward communication path SU21 and the current source 5U. Further, the lower-stage measuring unit M2 includes a transmitting portion 7U configured to transmit to the upper-stage measuring unit M1 a current signal transmitted from the further-lower-stage measuring unit M3 or the controller 2. The transmitting portion 7U switches between the connection establishment and connection cut of the switch 6U based on the current signal transmitted from the lower-stage measuring unit M3 or the controller 2. The current source 5U is configured to supply a current in a direction from the drive voltage line LIO1 to the reference voltage line LSS2 (that is, in a direction from the upper-stage measuring unit M1 to the lower-stage measuring unit M2).

The upper-stage measuring unit M1 includes a receiving portion 8U configured to receive the current signal transmitted through the upward communication path SU21. Further, the upper-stage measuring unit M1 includes a comparator 9U to which the voltage applied to the upward communication path SL12 is input and which compares this voltage with a predetermined reference voltage. An output of the comparator 9U is input to the receiving portion 8U. A pull-up resistor 10U is connected between the drive voltage line LIO1 and the comparator 9U. In a state where a current is not flowing through the upward communication path SU21 (that is, in a state where the current communication is not being performed), a voltage higher than the reference voltage is applied to the comparator 9U by the pull-up resistor 10U, and the level of the voltage output from the comparator 9U is a predetermined H level. In contrast, in a case where the current source 5U is connected to the upward communication path SU21 by the switch 6U based on the current signal transmitted from the transmitting portion 7U, a current flows from the drive voltage line LIO1 through the upward communication path SU21 to the reference voltage line LSS2 (the current signal is transmitted). With this, the voltage input to the comparator 9U becomes lower than the reference voltage, and the level of the voltage output from the comparator 9U becomes an L level that is lower than the H level. Thus, the current communication is performed from the lower-stage measuring unit M2 to the upper-stage measuring unit M1 through the upward communication path SU21.

In the present embodiment, for ease of comprehension, FIG. 2 shows a circuit diagram in which the voltage between the pull-up resistor 10U and the comparator 9U is directly compared with the reference voltage. However, the present invention is not limited to this and may be configured so as to switch the voltage level of a signal output based on a differential input of the voltage between the pull-up resistor 10U and the comparator 9U (that is, to use a differential amplifier). In addition, it is preferable that the comparator 9U have a hysteresis. With this, the level of the voltage output from the comparator 9U can be prevented from frequently changing in accordance with a noise of the current signal.

Further, the upper-stage measuring unit M1 includes: a clamp circuit 11U configured to prevent an overcurrent from flowing through the upward communication path SU21; and an N-channel MOS transistor (GGNMOS) 12U diode-connected between the upward communication path SU21 and a reference voltage line LSS1. The GGNMOS 12U prevents an electrostatic discharge failure of the upper-stage measuring unit M1. Similarly, the lower-stage measuring unit M2 includes: a diode D1U connected between a power supply voltage line LDD2 and the upward communication path SU21; and a diode D2U connected between the upward communication path SU21 and the reference voltage line LSS2. The diodes D1U and D2U prevent the electrostatic discharge failure of the lower-stage measuring unit M2 and a short between the upward communication path SU21 and the power supply voltage line LDD2 or between the upward communication path SU21 and the reference voltage line LSS2.

As described above, it is ideal that the potential difference is not generated between the power supply voltage line LDD2 and the reference voltage line LSS1. However, especially in the battery installed in the HEV, the EV, or the like, since the disturbances and oscillation ripples easily increase by oscillations, external environments, or the like, the potential difference is easily generated between the power supply voltage line LDD2 and the reference voltage line LSS1. According to the conventional configuration, there is a possibility that if the potential difference is generated between the power supply voltage line LDD2 and the reference voltage line LSS1, a current flows from the reference voltage line LSS1 through the GGNMOS 12U, the upward communication path SU21, and the diode D1U to the power supply voltage line LDD2. As above, if the potential difference is generated between the power supply voltage line LDD2 and the reference voltage line LSS1, a current whose direction is the same as that of the current source 5U flows through the upward communication path SU21, so that the voltage applied to an input terminal of the comparator 9U becomes low. Therefore, there is a possibility that regardless of the existence or non-existence of the current signal, the level of the voltage output from the comparator 9U becomes the L level, and malfunctions occur.

In contrast, in the present embodiment, as shown in FIG. 2, the bidirectional diode circuit element 4U is connected to the upward communication path SU21 extending between the measuring units M1 and M2. Specifically, the upward communication path SU21 includes: first direction diodes D3 and D4, each of whose forward direction corresponds to the direction of a current flowing through the upward communication path SU21 based on the current source 5U; and a second direction diode D5 which is connected parallel to the first direction diodes D3 and D4 and whose forward direction is opposite to the direction of the current flowing through the upward communication path SU21. The bidirectional diode circuit element 4U is configured such that a forward voltage of the diode (in the present embodiment, the total of the forward voltages of the two first direction diodes D3 and D4) whose forward direction corresponds to the direction of the current flowing through the upward communication path SU21 based on the current source 5U (that is, corresponds to the direction from the upper-stage measuring unit M2 toward the lower-stage measuring unit M3) is 1 V or higher. Since the forward voltage of a typical diode is about 0.7 V, the forward voltage of 1 V or higher is realized by connecting the two diodes D3 and D4 in series such that the forward directions of the diodes D3 and D4 correspond to the direction of the current flowing through the upward communication path SU21 based on the current source 5U. However, the configuration for realizing the forward voltage of 1 V or higher is not limited to this. For example, three or more diodes may be connected in series, or a single diode by which the forward voltage of 1 V or higher is realized may be used.

As above, at the time of the current communication, the current source 5U is connected to the upward communication path SU21 by the switch 6U, and the current generated by the current source 5U flows through the upward communication path SU21 that is the communication channel. Thus, the current communication is performed. Here, the potential difference generated between the power supply voltage line LDD2 and the reference voltage line LSS1 by the disturbances, the current ripples, and the like is typically lower than 1 V. In contrast, in the bidirectional diode circuit element 4U, the forward voltage of the first direction diodes D3 and D4, each of whose forward direction corresponds to the direction of the current generated by the current source 5U, is 1 V or higher. Therefore, even if the potential difference of lower than 1 V is generated by the disturbances, the current ripples, and the like, the current can be effectively prevented from flowing through the upward communication path SU21.

Especially, the voltage measuring apparatus 3 of the present embodiment can be used as, for example, a cell voltage measuring apparatus for in-vehicle lithium ion batteries. With this, high reliability in-vehicle use can be secured, and the robustness of the system can be improved. The voltage measuring apparatus 3 of the present embodiment can be realized by just inserting into an existing voltage measuring apparatus a bidirectional diode circuit element constituted by a plurality of diodes. Thus, the voltage measuring apparatus having high reliability and high robustness can be produced at low cost. Such a voltage measuring apparatus can be used as not only an in-vehicle voltage measuring apparatus but also a general-purpose voltage measuring apparatus.

In the present embodiment, as shown in FIG. 2, each of the measuring units Mj is configured as a single integrated circuit chip Ej (E1, E2). Then, the bidirectional diode circuit element 4U is configured in the integrated circuit chip Ej of one of the adjacent measuring units Mj and Mk (in the present embodiment, the lower-stage measuring unit Mj that is one of the adjacent measuring units). To be specific, in the example of FIG. 2, the bidirectional diode circuit element 4U is formed in the integrated circuit chip E2 of the lower-stage measuring unit M2 that is one of the adjacent integrated circuit chips E1 and E2.

With this, the number of parts of the voltage measuring apparatus 3 can be effectively prevented from increasing. Even in a case where the diodes D3 and D4 which prevent the malfunctions caused by the potential difference and each of whose forward direction corresponds to the current communication direction are provided in the integrated circuit chip Ej, a path through which a current flows in a direction opposite to the current communication direction is formed by the second direction diode D5 which is included in the bidirectional diode circuit element 4U and whose forward direction is opposite to the current communication direction. With this, since the flow of the current in a direction opposite to the current communication direction by static electricity or the like is allowed, the break of the integrated circuit chip Ej by the electrostatic discharge failure can be prevented.

An object of the configuration of Japanese Laid-Open Patent Application Publication No. 2009-14498 is to suitably maintain the insulation property of the loop circuit including the battery cell array when a certain member has contacted the battery cell array, and a diode for preventing a current form flowing through the communication channel in an opposite direction is provided. Therefore, Japanese Laid-Open Patent Application Publication No. 2009-14498 is totally different in technical idea from the present invention that allows a current to flow in the opposite direction.

Embodiment 2

Next, the voltage measuring apparatus according to Embodiment 2 of the present invention will be explained.

Figure 3:
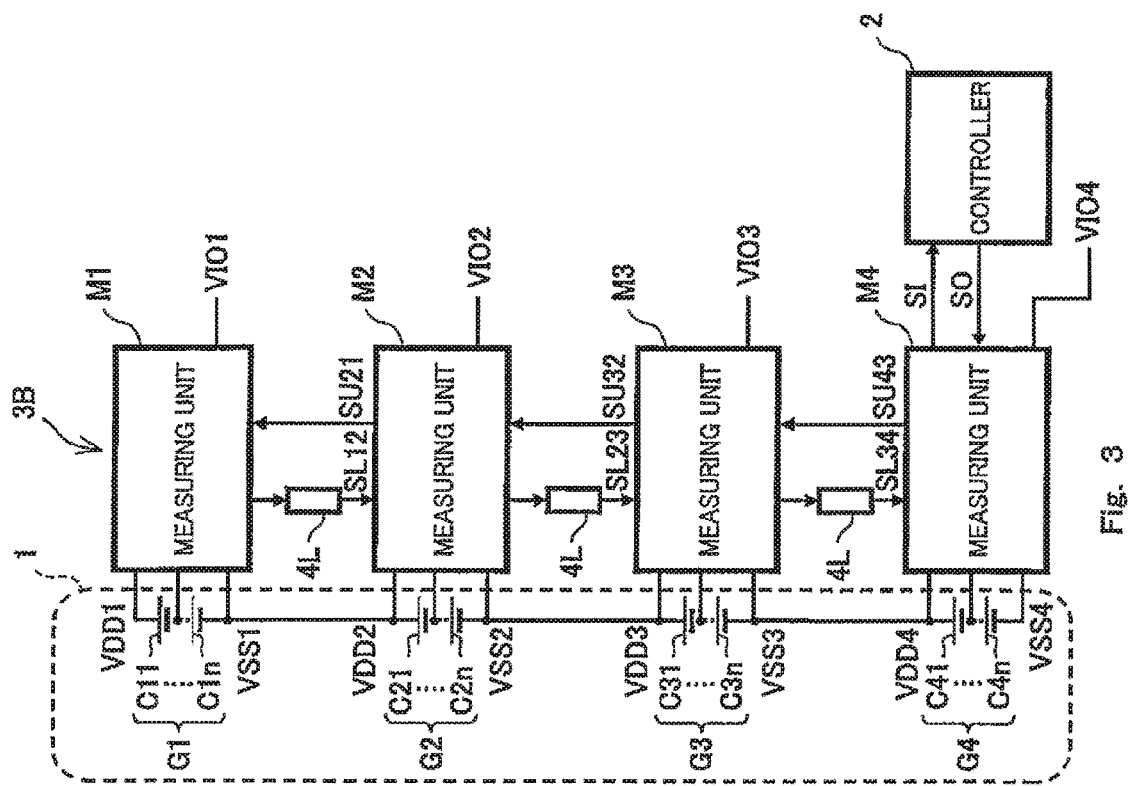
FIG. 3 is a circuit diagram showing a schematic configuration example of the battery system to which the voltage measuring apparatus according to Embodiment 2 of the present invention is applied.

FIG. 3 is a circuit diagram showing a schematic configuration example of the battery system to which the voltage measuring apparatus according to Embodiment 2 of the present invention is applied. In the present embodiment, the same reference signs are used for the same components as in Embodiment 1, and a repetition of the same explanation is avoided. As shown in FIG. 3, a voltage measuring apparatus 3B of the present embodiment is different from the voltage measuring apparatus 3 of Embodiment 1 in that instead of the bidirectional diode circuit element 4U, a bidirectional diode circuit element 4L is connected to the downward communication path SLjk.

Figure 4:
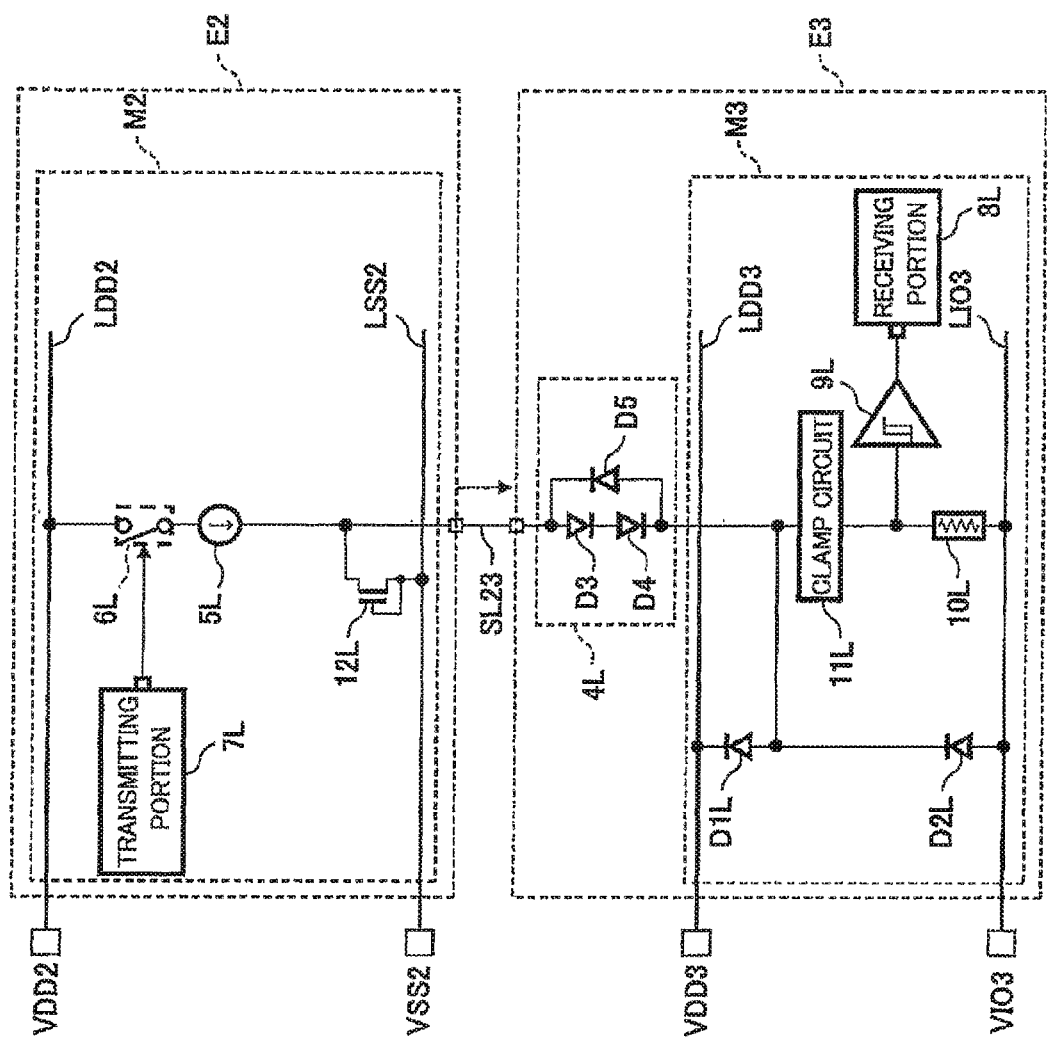
FIG. 4 is a circuit diagram showing a configuration example of communication between adjacent two of the measuring units of the voltage measuring apparatus shown in FIG. 3.
Figure 5:
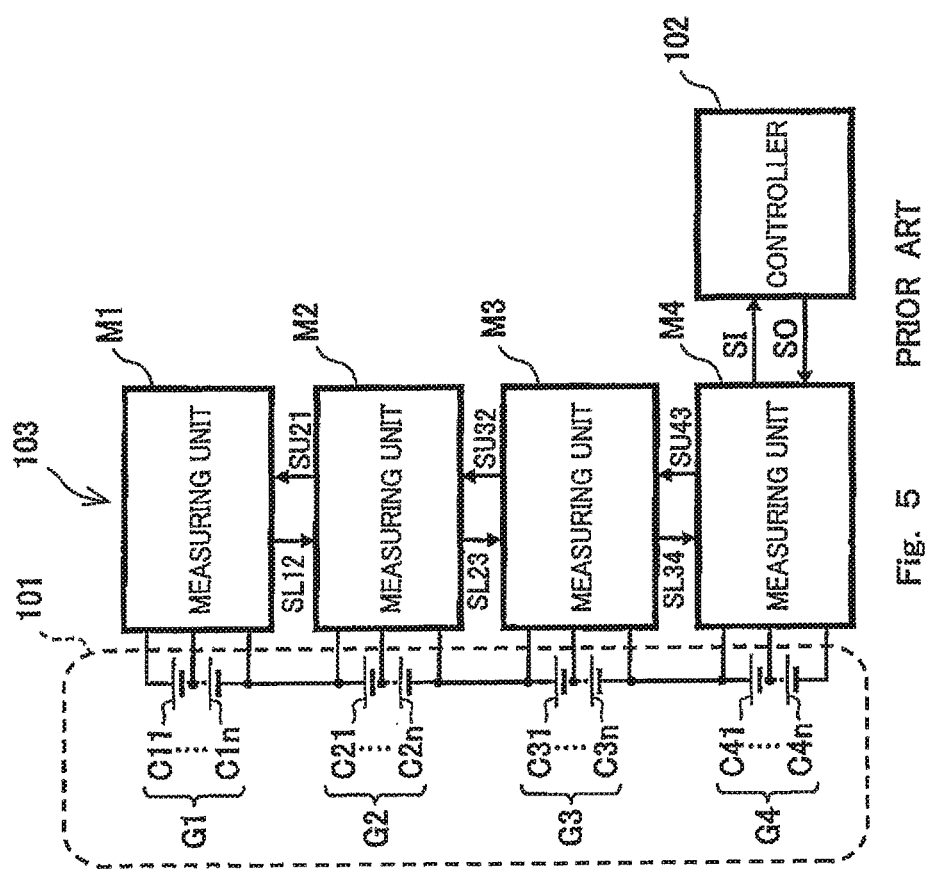
FIG. 5 is a circuit diagram showing a schematic configuration of a conventional battery system.

FIG. 4 is a circuit diagram showing a configuration example of communication between adjacent two of the measuring units of the voltage measuring apparatus shown in FIG. 3. FIG. 4 shows a channel of the current communication through a downward communication path SL23 extending between the measuring units M2 and M3. As shown in FIG. 4, the downward communication path SL23 that is the communication channel is provided to connect the power supply voltage line LDD2 of the upper-stage measuring unit M2 to which the power supply voltage VDD2 is applied and a drive voltage line LIO3 of the lower-stage measuring unit M3 to which a drive voltage VIO3 is applied.

A current source 5L configured to generate a current signal is configured to be connectable to the downward communication path SL23. Specifically, the current source 5L is provided at the upper-stage measuring unit M2, and the upper-stage measuring unit M2 includes a switch 6L configured to establish or cut the connection between the downward communication path SL23 and the current source 5L. Further, the upper-stage measuring unit M2 includes a transmitting portion 7L configured to transmit to the lower-stage measuring unit M3 a voltage value of the battery cell C2$i$ measured by the measuring unit M2 or a current signal transmitted from the further-upper-stage measuring unit M1. The transmitting portion 7L switches between the connection establishment and connection cut of the switch 6L based on the current signal generated by the measuring unit M2 (current signal based on the measured voltage value) or the current signal transmitted from the upper-stage measuring unit M1. The current source 5L is configured to supply a current in a direction from the power supply voltage line LDD2 to the drive voltage line LIO3 (that is, in a direction from the upper-stage measuring unit M2 to the lower-stage measuring unit M3).

The lower-stage measuring unit M3 includes a receiving portion 8L configured to receive the current signal transmitted through the downward communication path SL23. Further, the lower-stage measuring unit M3 includes a comparator 9L to which the voltage applied to the downward communication path SL23 is input and which compares this voltage with a predetermined reference voltage. An output of the comparator 9L is input to the receiving portion 8L. A pull-down resistor 10L is connected between the drive voltage line LIO3 and the comparator 9L. In a state where a current is not flowing through the downward communication path SL23 (that is, in a state where the current communication is not being performed), a voltage lower than the reference voltage is applied to the comparator 9L by the pull-down resistor 10L, and the level of the voltage output from the comparator 9L is the predetermined L level. In contrast, in a case where the current source 5L is connected to the downward communication path SL23 by the switch 6L based on the current signal transmitted from the transmitting portion 7L, a current flows from the power supply voltage line LDD2 through the downward communication path SL23 to the drive voltage line LIO3 (the current signal is transmitted). With this, the voltage input to the comparator 9L becomes higher than the reference voltage, and the level of the voltage output from the comparator 9L becomes the H level that is higher than the L level. Thus, the current communication is performed from the upper-stage measuring unit M2 to the lower-stage measuring unit M3 through the downward communication path SL23.

Further, the lower-stage measuring unit M3 includes a clamp circuit 11L configured to prevent an overcurrent from flowing through the downward communication path SL23; a diode D1L connected between the power supply voltage line LDD3 and the downward communication path SL23; and a diode D2L connected between the downward communication path SL23 and the drive voltage line LIO3. The diodes D1L and D2L prevent the electrostatic discharge failure of the lower-stage measuring unit M3 and a short between the downward communication path SL23 and the power supply voltage line LDD3 or between the downward communication path SL23 and the drive voltage line LIO3. Similarly, the upper-stage measuring unit M2 includes: an N-channel MOS transistor (GGNMOS) 12L diode-connected between the downward communication path SL23 and the reference voltage line LSS2. The GGNMOS 12L prevents the electrostatic discharge failure of the upper-stage measuring unit M2.

In the downward communication path SL23, there is a possibility that the potential difference is generated between the power supply voltage line LDD3 and the reference voltage line LSS2. According to the conventional configuration, there is a possibility that if the potential difference is generated between the power supply voltage line LDD3 and the reference voltage line LSS2, a current flows from the reference voltage line LSS2 through the diode D1L and the downward communication path SL23 to the power supply voltage line LDD3. As above, if the potential difference is generated between the power supply voltage line LDD2 and the reference voltage line LSS1, a current whose direction is the same as that of the current source 5L flows through the downward communication path SL23, so that the voltage applied to an input terminal of the comparator 9L becomes low. Therefore, there is a possibility that regardless of the existence or non-existence of the current signal, the level of the voltage output from the comparator 9L becomes the L level, and malfunctions occur.

In contrast, in the present embodiment, as shown in FIG. 4, the bidirectional diode circuit element 4L is connected to the downward communication path SL23 extending between the measuring units M2 and M3. Specifically, the downward communication path SL23 includes: the first direction diodes D3 and D4, each of whose forward direction corresponds to the direction (direction from the upper-stage measuring unit M2 to the lower-stage measuring unit M3) of a current flowing through the downward communication path SL23 based on the current source 5L; and the second direction diode D5 which is connected parallel to the first direction diodes D3 and D4 and whose forward direction is opposite to the direction of the current flowing through the downward communication path SL23. The bidirectional diode circuit element 4L is configured such that the forward voltage of the diode (in the present embodiment, the total of the forward voltages of the two first direction diodes D3 and D4) whose forward direction corresponds to the direction of the current flowing through the downward communication path SL23 based on the current source 5L is 1 V or higher. Since the forward voltage of a typical diode is about 0.7 V, the forward voltage of 1 V or higher is realized by connecting the two diodes D3 and D4 in series such that the forward directions of the diodes D3 and D4 correspond to the direction of the current flowing through the downward communication path SL23 based on the current source 5L. In the present embodiment, the configuration for realizing the forward voltage of 1 V or higher is not limited to this. For example, three or more diodes may be connected in series, or a single diode by which the forward voltage of 1 V or higher is realized may be used.

As above, in the present embodiment, in the bidirectional diode circuit element 4L, the forward voltage of the first direction diodes D3 and D4, each of whose forward direction corresponds to the direction of the current generated by the current source 5L is 1 V or higher. Therefore, even if the potential difference of lower than 1 V is generated by the disturbances, the current ripples, and the like, the current can be effectively prevented from flowing through the downward communication path SL23.

In the present embodiment, as shown in FIG. 4, each of the measuring units Mj is configured as a single integrated circuit chip Ej (E2, E3). Then, the bidirectional diode circuit element 4L is configured in the integrated circuit chip Ej of one of the adjacent measuring units Mj and Mk (in the present embodiment, the lower-stage measuring unit Mj that is one of the adjacent measuring units). To be specific, in the example of FIG. 4, the bidirectional diode circuit element 4L is formed in the integrated circuit chip E3 of the lower-stage measuring unit M3 that is one of the adjacent integrated circuit chips E2 and E3.

With this, the number of parts of the voltage measuring apparatus 3 can be effectively prevented from increasing. Even in a case where the first direction diodes D3 and D4 which prevent the malfunctions caused by the potential difference and each of whose forward direction corresponds to the current communication direction are provided in the integrated circuit chip Ej, a path through which a current flows in a direction opposite to the current communication direction is formed by the second direction diode D5 whose forward direction is opposite to the current communication direction in the bidirectional diode circuit element 4L. With this, since the flow of the current in a direction opposite to the current communication direction by static electricity or the like is allowed in the integrated circuit chip Ej, the break of the integrated circuit chip Ej by the electrostatic discharge failure can be prevented.

The foregoing has explained the embodiments of the present invention. However, the present invention is not limited to the above embodiments, and various improvements, changes, and modifications may be made within the scope of the present invention. For example, respective components in the above embodiments may be combined arbitrarily. To be specific, the bidirectional diode circuit element 4U may be connected to the upward communication path SUkj, and the bidirectional diode circuit element 4L may be connected to the downward communication path SLjk. The communication channel to which the bidirectional diode circuit element 4U or 4L is connected is suitably selected based on the use environment of the voltage measuring apparatus 3, the characteristics of the battery cell array 1 that is a measurement target, and the like.

Each of the above embodiments has explained the configuration in which the bidirectional diode circuit elements 4U or 4L are respectively provided at all the communication channels SU or SL (three communication channels in each of the above embodiments including four measuring units M1 to M4) each located between the adjacent measuring units Mj and Mk. However, the present invention is not limited to this. For example, the bidirectional diode circuit element 4U or 4L may be provided at only the communication channel SU or SL extending between specific measuring units (such as between the measuring units M1 and M2), or the bidirectional diode circuit elements 4U or 4L may be respectively provided at some of the communication channels SU or SL each extending between the adjacent measuring units Mj and Mk.

Each of the above embodiments has explained the configuration in which the bidirectional diode circuit element 4U or 4L is provided on the integrated circuit chip on which the lower-stage measuring unit Mj that is one of the adjacent measuring units Mj and Mk is provided. However, the bidirectional diode circuit element 4U or 4L may be provided on the integrated circuit chip on which the upper-stage measuring unit Mk is provided. Whether the integrated circuit chip on which the bidirectional diode circuit element 4U or 4L is mounted is provided at the upper-stage measuring unit Mk or the lower-stage measuring unit Mj can be suitably determined from the viewpoint of the ease of manufacture, high reliability, and the like regarding the manufacturing process of the integrated circuit chip and the like. The bidirectional diode circuit element 4U, 4L may be configured separately from the integrated circuit chip constituting the measuring unit Mj, Mk.

From the foregoing explanation, many modifications and other embodiments of the present invention are obvious to one skilled in the art. Therefore, the foregoing explanation should be interpreted only as an example and is provided for the purpose of teaching the best mode for carrying out the present invention to one skilled in the art. The structures and/or functional details may be substantially modified within the spirit of the present invention.

INDUSTRIAL APPLICABILITY

The voltage measuring apparatus of the present invention is useful to properly perform current communication even if a potential difference is generated between a power supply voltage and a reference voltage in adjacent battery cells.

What is claimed is:

1. An integrated circuit device provided at each of a plurality of battery cell groups of a battery system including a battery cell array including the plurality of battery cell groups,
the integrated circuit device comprising a measuring unit configured to measure a voltage of one of battery cells of a corresponding one of the battery cell groups, wherein:
when the measuring unit is a measuring unit at a high potential side, and a measuring unit of an adjacent integrated circuit device is a measuring unit at a low potential side,
the measuring unit at the low potential side is configured to receive (i) a current for first communication by which the measuring unit at the low potential side receives a measurement result of the voltage of the one battery cell, the voltage being measured by the measuring unit at the high potential side or (ii) a current for second communication by which the measuring unit at the low potential side transmits a drive command to the measuring unit at the high potential side, and
in at least one of the first communication and the second communication, the measuring unit at the high potential side allows an input of a reverse current, the reverse current flowing in a direction opposite to a direction of the current for a corresponding one of the first communication and the second communication.

2. The battery system according to claim 1, wherein a current generated by a potential difference between a power supply voltage input to the measuring unit at the low potential side and a reference voltage input to the measuring unit at the high potential side is not input to the measuring unit at the low potential side.

3. The integrated circuit device according to claim 1, wherein the measuring unit at the high potential side includes a transmitting portion configured to transmit a current signal.

4. The integrated circuit device according to claim 3, wherein the measuring unit at the high potential side further includes:
a current source configured to generate the current signal; and
a switch connected to the current source.

5. The integrated circuit device according to claim 3, wherein the measuring unit at the high potential side further includes a diode configured to prevent an electrostatic discharge failure.

6. The integrated circuit device according to claim 1, wherein the measuring unit at the low potential side includes a receiving portion configured to receive a current signal.

7. The integrated circuit device according to claim 6, wherein the measuring unit at the low potential side further includes:
a comparator; and
a pull-down resistor connected to the comparator.

8. The integrated circuit device according to claim 7, wherein the measuring unit at the low potential side compares a voltage between the comparator and the pull-down resistor with a reference voltage.

9. The integrated circuit device according to claim 7, wherein the measuring unit at the low potential side switches a voltage level output based on a differential input of a voltage between the comparator and the pull-down resistor.

10. The integrated circuit device according to claim 7, wherein the comparator includes a hysteresis.

11. The integrated circuit device according to claim 6, wherein the measuring unit at the low potential side further includes:
a clamp circuit; and
a MOS transistor configured to prevent an electrostatic discharge failure.

12. The integrated circuit device according to claim 1, wherein the integrated circuit device is connected to the adjacent integrated circuit device by a daisy chain connection.

13. The integrated circuit device according to claim 1, wherein the measuring unit at the low potential side includes a transmitting portion configured to transmit a current signal.

14. The integrated circuit device according to claim 13, wherein the measuring unit at the low potential side further includes:
a current source configured to generate the current signal; and
a switch connected to the current source.

15. The integrated circuit device according to claim 13, wherein the measuring unit at the low potential side further includes a diode configured to prevent an electrostatic discharge failure.

16. The integrated circuit device according to claim 1, wherein the measuring unit at the high potential side includes a receiving portion configured to receive a current signal.

17. The integrated circuit device according to claim 16, wherein the measuring unit at the high potential side further includes:
   a comparator; and
   a pull-up resistor connected to the comparator.

18. The integrated circuit device according to claim 17, wherein the measuring unit at the high potential side compares a voltage between the comparator and the pull-up resistor with a reference voltage.

19. The integrated circuit device according to claim 17, wherein the measuring unit at the high potential side switches a voltage level output based on a differential input of a voltage between the comparator and the pull-up resistor.

20. The integrated circuit device according to claim 17, wherein the comparator includes a hysteresis.

21. The integrated circuit device according to claim 16, wherein the measuring unit at the high potential side further includes:
   a clamp circuit; and
   a MOS transistor configured to prevent an electrostatic discharge failure.

22. The integrated circuit device according to claim 1, wherein the reverse current is a current generated by static electricity.

23. A battery system comprising:
   a battery cell array including a plurality of battery cell groups each including a predetermined number of battery cells connected in series; and
   a voltage measuring apparatus configured to measure voltages of the respective battery cell groups, wherein:
   the voltage measuring apparatus includes a plurality of measuring units each provided for each of the battery cell groups;
   each of the plurality of measuring units measures voltages of the battery cells of a corresponding one of the battery cell groups; and
   when one of the plurality of measuring units is a measuring unit at a high potential side, and a measuring unit adjacent to the measuring unit at the high potential side is a measuring unit at a low potential side,
   the measuring unit at the low potential side is configured to receive (i) a current for first communication by which the measuring unit at the low potential side receives a measurement result of the voltages of the battery cells of the battery cell group, the voltages being measured by the measuring unit at the high potential side or (ii) a current for second communication by which the measuring unit at the low potential side transmits a drive command to the measuring unit at the high potential side, and
   in at least one of the first communication and the second communication, the measuring unit at the high potential side allows an input of a reverse current, the reverse current flowing in a direction opposite to a direction of the current for a corresponding one of the first communication and the second communication.

24. The battery system according to claim 23, wherein a current generated by a disturbance or a current ripple is not input to the measuring unit at the low potential side.

25. The battery system according to claim 23, further comprising at least one controller configured to perform measurement control of the plurality of measuring units and measured value management.

26. The battery system according to claim 25, wherein the at least one controller is one controller configured to control the plurality of measuring units.

27. The battery system according to claim 23, wherein the plurality of measuring units are configured by a daisy chain connection.

28. The battery system according to claim 23, wherein the battery cells are lithium ion battery cells.

29. The battery system according to claim 23, wherein a current generated by a potential difference between a power supply voltage input to the measuring unit at the low potential side and a reference voltage input to the measuring unit at the high potential side is not input to the measuring unit at the low potential side.

30. The battery system according to claim 23, wherein the reverse current is a current generated by static electricity.

\* \* \* \* \*